United States Patent
Kallingal et al.

(10) Patent No.: US 7,071,124 B1
(45) Date of Patent: Jul. 4, 2006

(54) METHOD TO REDUCE PEB SENSITIVITY OF RESIST

(75) Inventors: Chidam Kallingal, Wappingers Falls, NY (US); Hoyoung Kang, Rosemount, MN (US); Prakash Krishnan, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/950,362

(22) Filed: Sep. 24, 2004

Related U.S. Application Data

(60) Provisional application No. 60/506,184, filed on Sep. 26, 2003.

(51) Int. Cl.
*H01L 21/30* (2006.01)
*G03C 5/00* (2006.01)

(52) U.S. Cl. .................. 438/781; 438/780; 430/311; 430/330

(58) Field of Classification Search ............... 438/780, 438/781; 430/311, 330
See application file for complete search history.

(56) References Cited

U.S. PATENT DOCUMENTS

| | | | | |
|---|---|---|---|---|
| 5,877,075 | A * | 3/1999 | Dai et al. ................. | 438/597 |
| 5,985,363 | A * | 11/1999 | Shiau et al. .............. | 427/240 |
| 6,335,152 | B1 * | 1/2002 | Subramanian et al. ..... | 430/325 |
| 6,344,412 | B1 * | 2/2002 | Ichikawa et al. .......... | 438/661 |
| 6,485,895 | B1 * | 11/2002 | Choi et al. ................ | 430/330 |
| 6,534,422 | B1 * | 3/2003 | Ichikawa et al. .......... | 438/780 |
| 6,566,280 | B1 * | 5/2003 | Meagley et al. ........... | 438/780 |
| 6,709,805 | B1 * | 3/2004 | Patil ........................ | 430/320 |
| 6,803,176 | B1 * | 10/2004 | Choi et al. ................ | 430/330 |
| 6,833,326 | B1 * | 12/2004 | Koh et al. ................. | 438/725 |
| 2003/0152875 | A1 * | 8/2003 | Morales et al. ........... | 430/330 |
| 2004/0265713 | A1 * | 12/2004 | Shiobara et al. .......... | 430/30 |
| 2005/0008979 | A1 * | 1/2005 | Hayasaki et al. .......... | 430/330 |

\* cited by examiner

*Primary Examiner*—Alexander Ghyka
(74) *Attorney, Agent, or Firm*—Evan Law Group LLC

(57) ABSTRACT

A method of forming a semiconductor structure, comprises exposing a photoresist layer; followed by heating the photoresist layer to a first temperature for 30 seconds to 3 minutes; followed by heating the photoresist layer to a second temperature for 30 seconds to 3 minutes. The second temperature is 5–15° C. greater than the first temperature.

19 Claims, 8 Drawing Sheets

TOK 6100

METHOD TO REDUCE PEB SENSITIVITY OF RESIST

CROSS REFERENCE TO RELATED APPLICATION

This application claims the benefit of U.S. Provisional Application No. 60/506,184 filed 26 Sep. 2003.

BACKGROUND

There is an ongoing need to reduce the size of the elements within integrated circuits and semiconductor structures. As the size of an element is reduced, shorter wavelength radiation is needed to for exposing the photoresist in order to obtain the smaller features desired. Consequently, photoresists sensitive to the shorter wavelength radiation must also be used. In order to obtain features on the order of 0.1 micron, radiation having a wavelength of 193 nm is used, and the photoresists sensitive to this wavelength are referred to as 193 nm resists. A variety of these resists are commercially available, such as T9269 (from Clariant International, Ltd., Muttenz, Switzerland), 6A100 (or TOK 6100) (Tokyo Ohka Kogyo, Kawasaki-shi, Japan), and AR414 and AR237 (both from Japan Synthetic Rubber Co., Ltd., Tokyo, Japan).

After exposure of the resist, it is baked. This is referred to as post exposure bake. Typically, the post exposure bake involves heating the resist to 130° C. for 90 seconds. A disadvantage, however, is that the resist suffers from post exposure bake sensitivity, resulting in poor CD (critical dimension) control. Post exposure bake sensitivity is greater in 193 nm resists than in 248 nm resists.

FIG. 1A illustrates the CD control of this process. Here, a polysilicon layer was patterned on a set of wafers, to form semi-dense lines (the lines are 240 nm apart). Sixteen wafers were prepared. Each wafer was measured at 8 fields, and 6 data points were measured in each field of wafers 1, 8 and 16.

The vertical axis represents the width of these lines, while the horizontal axis represents the temperature of the post exposure bake. The shape of the data point correlates with the exposure energy. As can be seen, the CD varies with energy of exposure, and the slope of the line represents the post exposure bake sensitivity which is 6.71 nm/degree. FIG. 1B includes a point for each measurement taken, and more clearly illustrates the variation in CD. The 6 sigma value of wafer to wafer variation (the standard deviation for the average of each wafer, multiplied by 6) was 5.7 nm.

BRIEF SUMMARY

In a first aspect, the present invention is a method of forming a semiconductor structure, comprising exposing a photoresist layer; followed by heating the photoresist layer to a first temperature for 30 seconds to 3 minutes; followed by heating the photoresist layer to a second temperature for 30 seconds to 3 minutes. The second temperature is 5–15° C. greater than the first temperature.

In a second aspect, the present invention is a method of forming semiconductor structures, comprising exposing a photoresist layer; followed by heating the photoresist layer to a first temperature; followed by heating the photoresist layer to a second temperature; followed by developing the photoresist layer. The second temperature is 5–15° C. greater than the first temperature, and the standard deviation of the critical dimension between wafers is at least 10% smaller than the standard deviation of the critical dimension between wafers otherwise identical without the first heating.

DETAILED DESCRIPTION

Figure 1A:
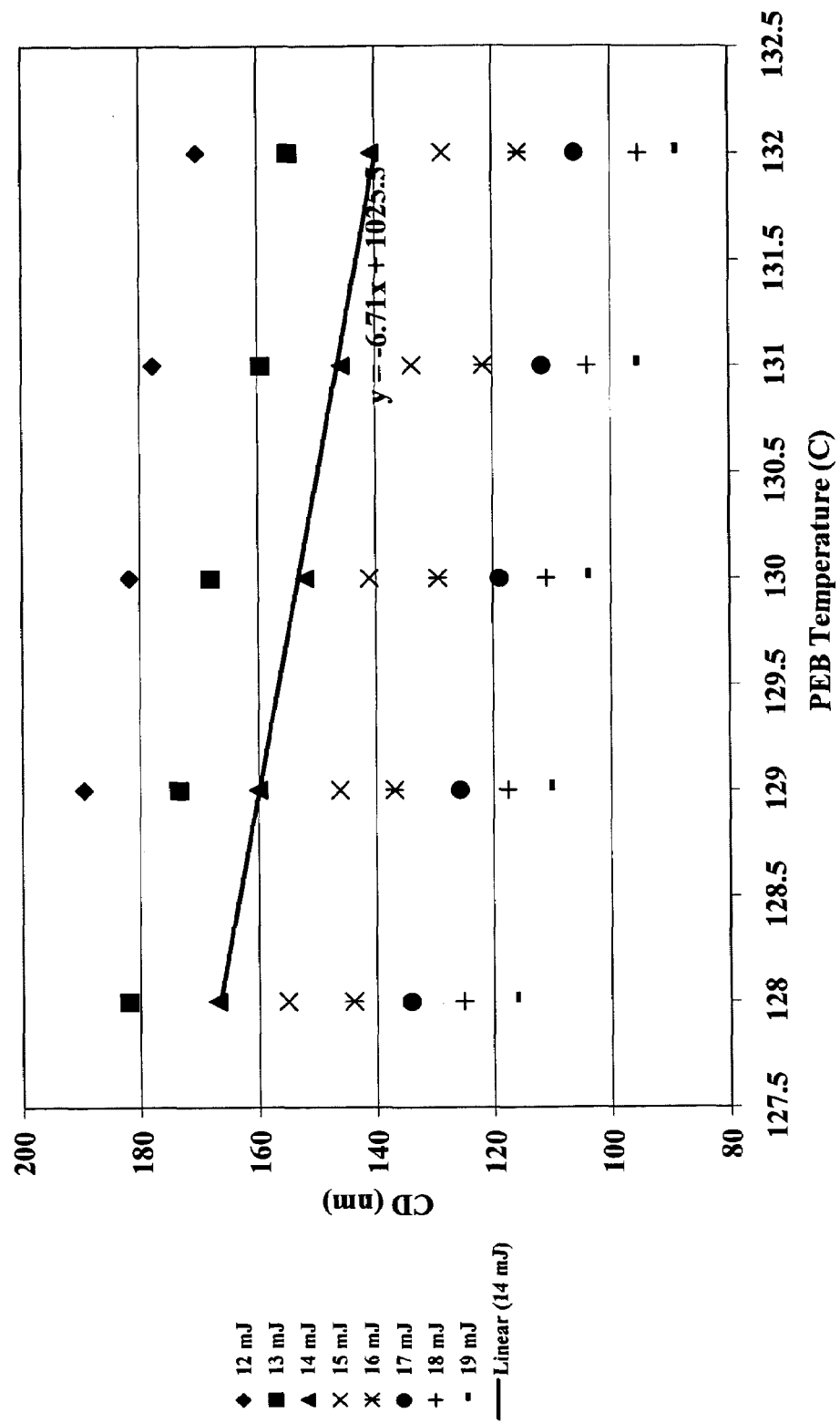
FIG. 1A illustrates the CD control of a typical photoresist development process.
Figure 1B:
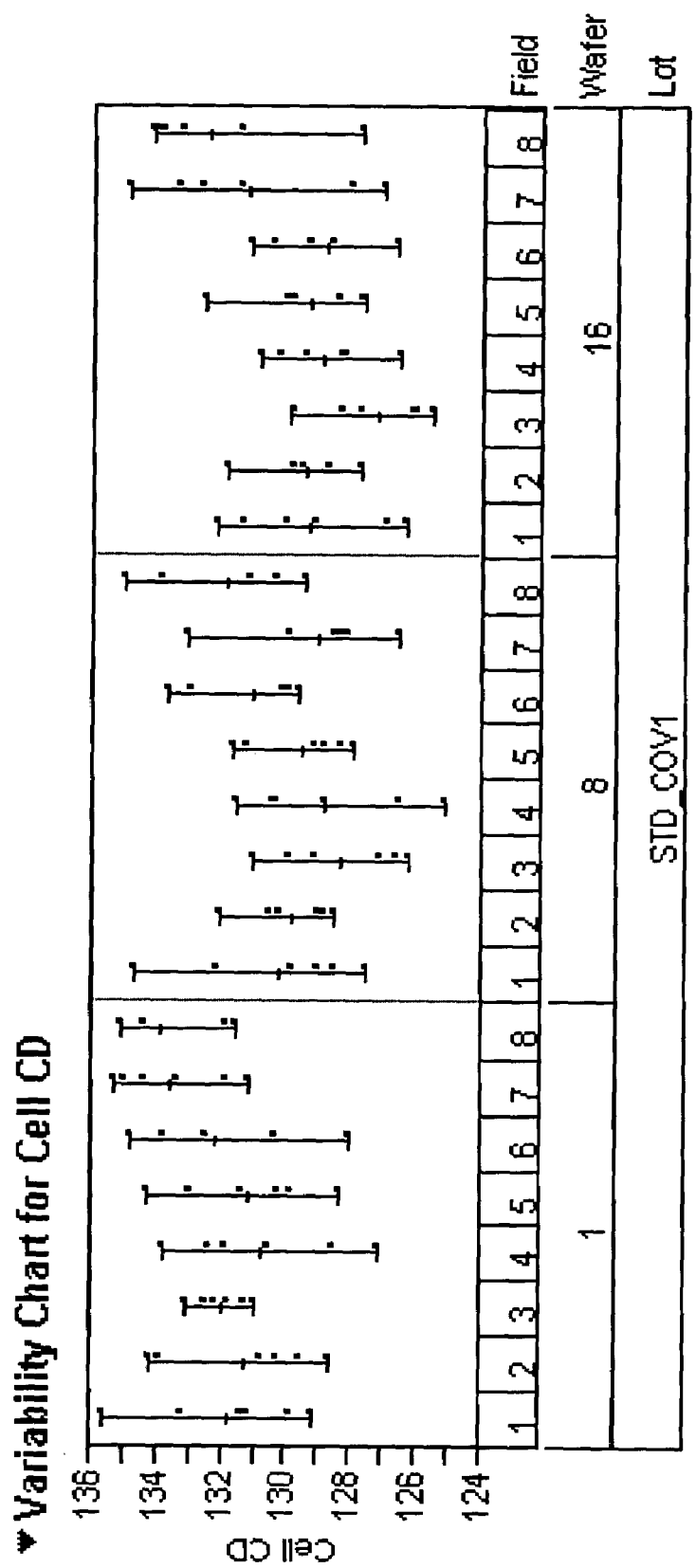
FIG. 1B is a variability chart for cell CD of a typical photoresist development process.

The present invention makes use of the discovery that a prior heating, prior to the post exposure bake, and at a lower temperature than the post exposure bake, will reduce post exposure bake sensitivity, resulting in superior CD control. One possible explanation for why the prior heating reduces post exposure bake sensitivity is that some of the acid generated during the exposure is lost during the prior heating. However, diffusion and amplification, which are required for pattern formation, take place at a much lower rate at the lower temperature. In the post exposure bake, the higher temperature aids diffusion and amplification, which complete pattern formation. As some of the acid is lost in the prior heating, the CD is not very sensitive to the temperature of the post exposure bake. The CD is not very sensitive to the prior heating temperature either. This results in lower CD variation: preferably at least a 10% reduction is the standard deviation of the CD within a wafer or between wafers, more preferably at least a 15% reduction is the standard deviation, and most preferably, at least a 20% reduction in the standard deviation.

The prior heating is preferably carried out at a temperature of 90–140° C., more preferably at 100–130° C., and most preferably 115–125° C. The heating is preferably carried out for 30 seconds to 3 minutes, more preferably 45 seconds to 3 minutes, most preferably for 1–2 minutes. As with the post exposure bake, the prior heating is preferably carried out in air, or under an inert gas such as nitrogen.

The post exposure bake is preferably carried out at a temperature of 100–150° C., more preferably at 110–140° C. and most preferably 125–135° C. Preferably, the post exposure bake is carried out at a temperature that is 5–15° C. hotter than the prior heating, including about 10° C. hotter. The post exposure bake is preferably carried out for 30 seconds to 3 minutes, more preferably for 45 seconds to 3 minutes, most preferably 1–2 minutes.

The prior heating, together with the post exposure bake, is preferably carried out every time a photoresist is used in forming a semiconductor structure. Typical processing is as follows:

1. Coat anti-reflective coating on wafer and bake in oven.
2. Cool the wafer on a chill plate.
3. Coat 2850 Angstrom of resist on wafer followed by bake in oven.
4. Cool the wafer on a chill plate.
5. Expose wafer in the scanner.
6. Prior heating of wafer in oven at a lower temperature of 120° C. and 90 seconds.

7. Post exposure bake of wafer in oven at a higher temperature of 130° C. for 90 seconds.
8. Cool the wafer on a chill plate.
9. Develop the wafer to produce the resist pattern.

In order to determine CD control, a polysilicon layer is patterned on a set of sixteen wafers, to form semi-dense lines (the lines are about 240 nm apart). Each wafer is measured at 8 fields, and 6 data points are measured in each field of wafers 1, 8 and 16. The energy of exposure is varied from 12 mJ to 17 mJ, in 1 mJ increments. From a graph of the data obtained the vertical axis represents the width of these lines, while the horizontal axis represents the temperature of the post exposure bake, and the post exposure bake sensitivity corresponds with the slope of the line as the temperature is varied while the energy of exposure is kept constant. The 6 sigma value of wafer to wafer variation may also be determined from the data by standard statistical analysis.

Figure 10A:
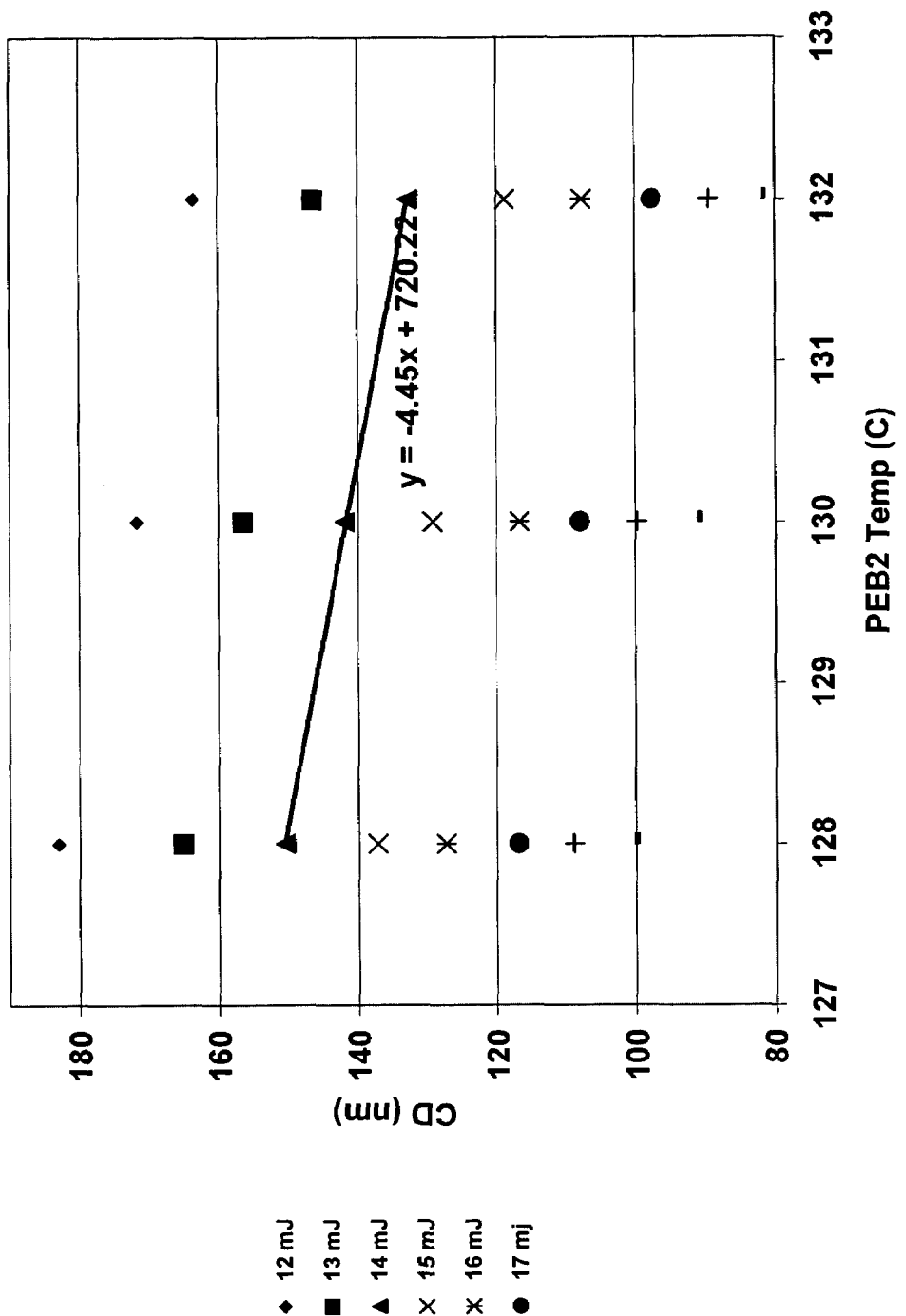
FIG. 10A illustrates the CD control of a photoresist development process of the present invention.
Figure 10B:
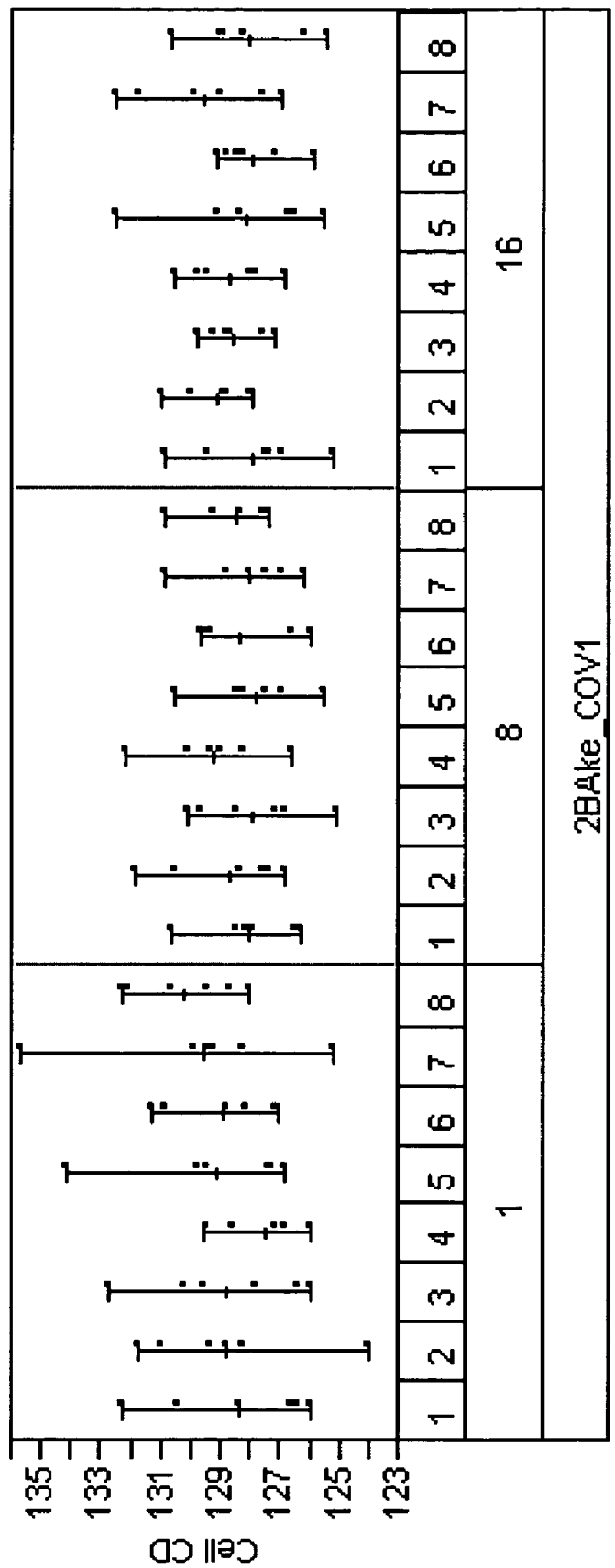
FIG. 10B is a variability chart for cell CD of a photoresist development process of the present invention.

FIG. 10A illustrates the CD control of the process of the present invention. The shape of the data point correlates with the energy of exposure. As can be seen, the CD varies with energy of exposure, and the slope of the line represents the post exposure bake sensitivity which is 4.45 nm/degree. FIG. 10B includes a point for each measurement taken, and more clearly illustrates the variation in CD. The 6 sigma value of wafer to wafer variation (the standard deviation for the average of each wafer, multiplied by 6) was 1.1 nm.

The overall process of forming a gate stack is next described.

Figure 2:
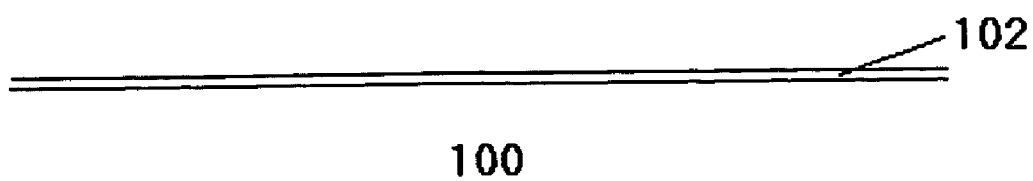
FIGS. 2–8 illustrate a method of forming a structure of FIG. 9.

Referring to FIG. 2, a gate insulating layer 102 is on a semiconductor substrate 100. The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer 102 may be a conventionally known insulating material. For example, the gate insulating layer may contain silicon oxide or silicon oxynitride.

Figure 3:
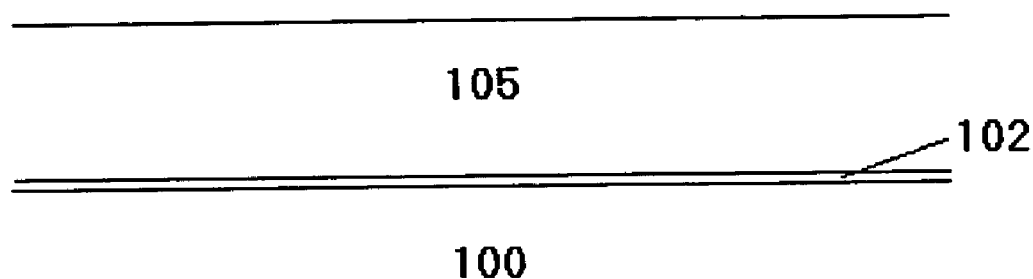

Referring to FIG. 3, a gate layer 105 may be formed on the gate insulating layer. The gate layer may contain a variety of semiconducting materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are $P^+$ doped (such as with B or $BF_2^+$) are over $N^-$ doped channel regions of the substrate, forming a PMOS device; those regions of the gate that are $N^+$ doped (such as with $As^+$ or $phosphorus^+$) are over $P^-$ doped channel regions of the substrate, forming an NMOS device. The $P^+$ and $N^+$ doping regions of the gate are separated by a region which is on an isolation region of the substrate; this isolation region has a width of at most 0.4 microns, more preferably at most 0.36 microns. The doping of the regions of the gate is preferably carried out after forming the gate, by masking and doping each region separately, or by an overall doping of the gate with one dopant type, and then masking and doping only one region with the other dopant type (counter doping).

Figure 4:
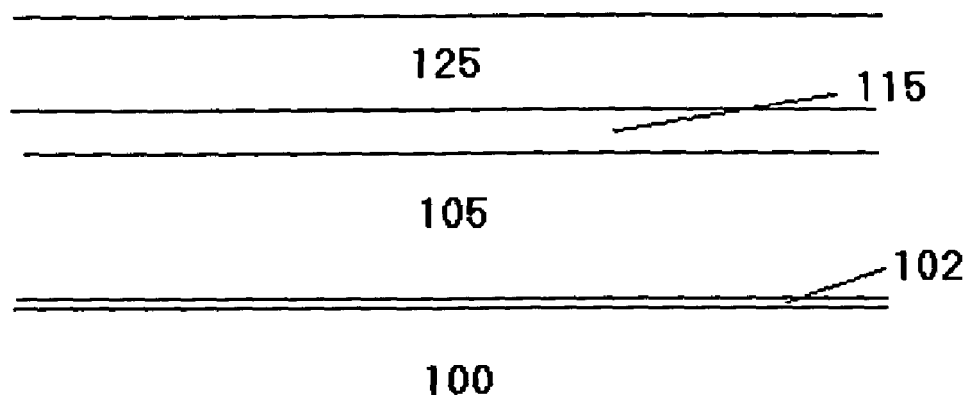

Referring to FIG. 4, a barrier layer 115 may optionally be formed on the gate layer. The optional barrier layer may contain a variety of materials, including nitrides, silicides, and oxides, and is preferably a conductive material. For example, the barrier layer may contain refractory suicides and nitrides. Preferably, the barrier layer contains silicon nitride, or a nitride or silicide of a metal such as tantalum, titanium, niobium or tungsten, for example tungsten nitride.

Referring still to FIG. 4, a metallic layer 125 may be formed on the gate layer, or the barrier layer 115, if it is present. Preferably, the metallic layer has a thickness of 200–600 angstroms, more preferably 300–500 angstroms, most preferably 325–450 angstroms. The metallic layer 125 may contain a variety of metal-containing materials. For example, a metallic layer may contain aluminum, copper, tantalum, titanium, tungsten, or alloys or compounds thereof. Preferably, the metallic layer comprises tungsten or titanium. The metallic layer may be formed, for example, by physical vapor deposition (PVD) of the metal, or by low pressure chemical vapor deposition (LPCVD) of a mixture of a metal halide and hydrogen.

Figure 5:
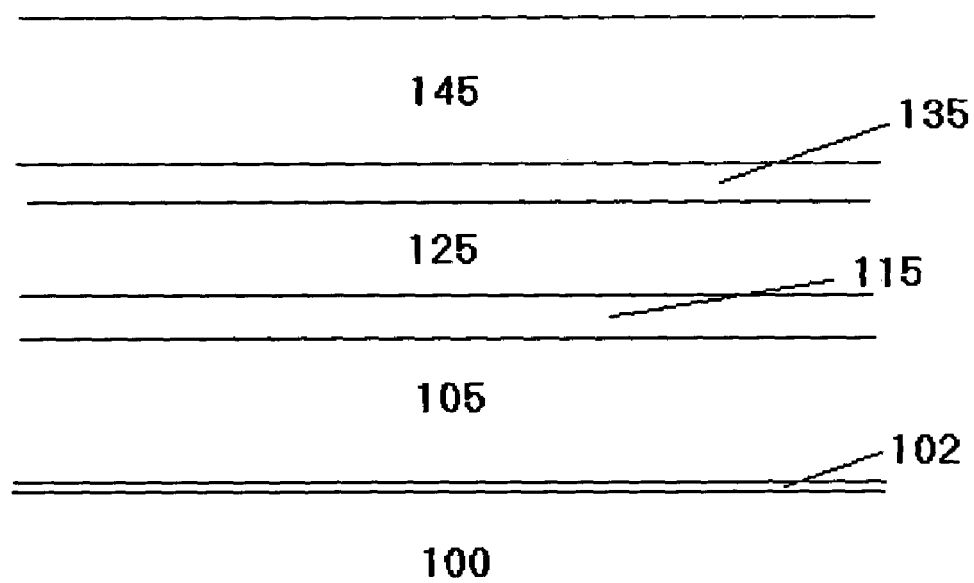

Referring to FIG. 5, a barrier layer 135 may optionally be formed on the metallic layer. The formation of the second optional barrier layer may be performed as described for the first optional barrier layer 115, and this layer may be formed of the same materials, and to the same thicknesses.

Referring still to FIG. 5, an etch-stop layer 145 may be formed on the metallic layer by a variety of methods, including chemical vapor deposition (CVD). Preferably, the etch-stop layer is a nitride layer. More preferably, the etch-stop layer is silicon nitride formed by PECVD. The etch-stop layer may vary in composition, so that the top of the etch-stop layer is anti-reflective, for example so that the top of the etch-stop layer is silicon rich silicon nitride, or silicon oxynitride; this layer may also act as a hard mask to protect the etch-stop layer during subsequent etches. Alternatively, a separate anti-reflective layer (ARC) may be formed.

Preferably, the etch-stop layer is formed rapidly at a relatively low temperature. For example, if the gate layer contains both $P^+$ and $N^+$ doping regions, diffusion of the dopants may occur if the wafer is maintained at sufficiently high temperatures for a prolonged period of time. Thus, it is desirable that any high temperature processing is performed only for relatively short periods of time. Likewise, it is desirable that any lengthy processing is carried out at relatively low temperatures. Preferably, the etch-stop layer is formed at a temperature of at most 750° C., if the atmosphere is substantially devoid of oxygen, or in a reducing environment (hydrogen rich). Under typical conditions, a temperature of at most 600° C. is preferred; at most 450° C. is more preferred. A temperature of at least 350° C. is preferred, such as 400° C. The depositing of the etch-stop layer is preferably carried out at a temperature and for a time that does not result in substantial diffusion between the $P^+$ region and the $N^+$ region in a split gate.

Preferably, the etch-stop layer has a thickness of at least 800 angstroms, more preferably a thickness of at least 1100 angstroms, most preferably a thickness of at least 1200, after etching of the gate layer, and after formation of gate spacers. About 500 angstroms of etch-stop may be lost during the gate layer etch, and about 200 angstroms of etch-stop may be lost during the spacer formation. Preferably, at least 1500 angstroms thickness of etch-stop are deposited, more preferably at least 1800 angstroms thickness of etch-stop are deposited, most preferably 2100 angstroms thickness of etch-stop are deposited. Preferably, after the gate layer etch and after spacer formation (or, alternatively, after the dielectric layer is formed), the etch-stop layer has a thickness of 800–1800 angstroms, more preferably a thickness of 1100–1500 angstroms, most preferably a thickness of 1200–1400 angstroms. Similarly, the thickness deposited would preferably be these same ranges, with an additional 700 angstroms added to accommodate loss during the gate layer etch and spacer formation, when material are used which may result in a loss of the etch-stop layer at these points in the process.

Figure 6:
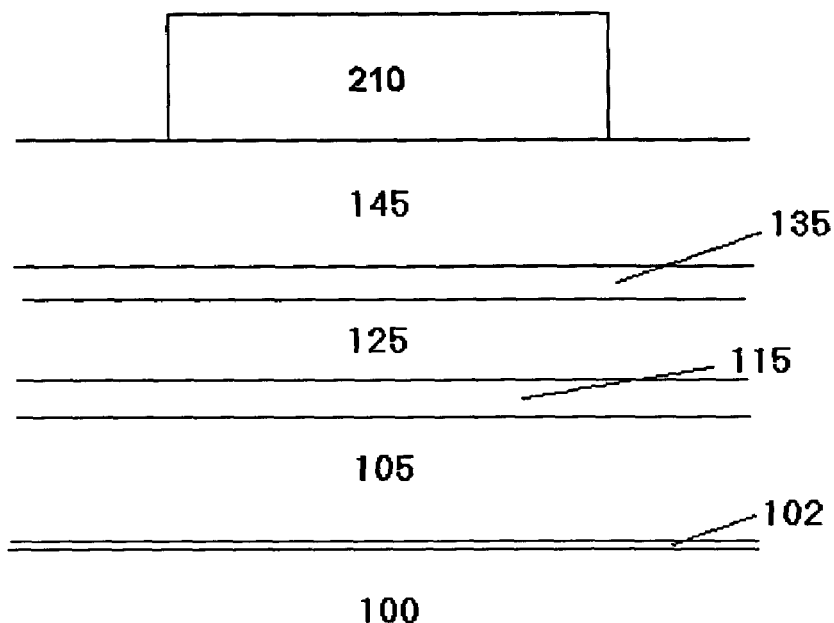
Figure 7:
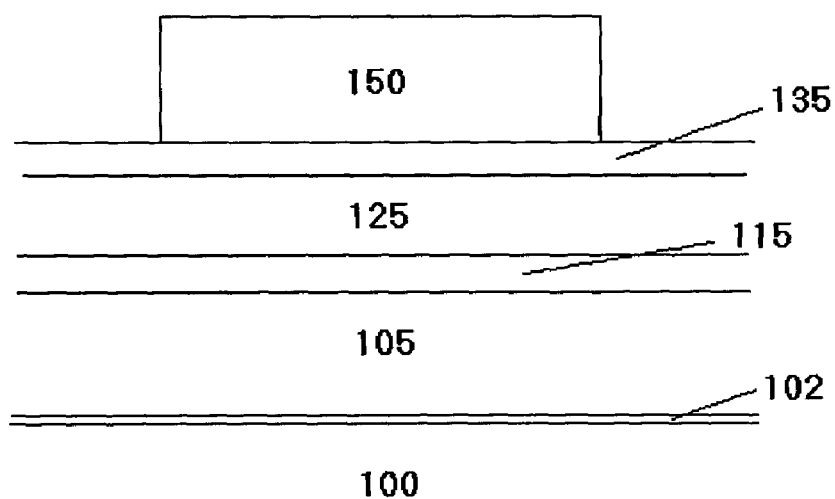

Referring to FIGS. 6–9, each layer may be patterned to form the gate stack. The patterning may be accomplished, for example, by conventional photolithographic and etching techniques, and when the photoresist is applied and exposed, heating prior to the post exposure bake, in accordance with the present invention, is included. Referring to FIGS. 6 and 7, the etch-stop layer may be etched to form a patterned etch-stop layer 150, for example by forming a patterned photoresist 210 on etch-stop layer 145 (FIG. 6) and then etching the exposed portions of the layer. A hydrofluoric acid dip may be used to remove sidewall passivation.

The etch-stop etching may be carried out by exposure to a plasma formed from a mixture of gasses. Preferably, the gasses and plasma comprise carbon, fluorine and hydrogen. Preferably, the atomic ratio of fluorine:hydrogen is 43:1 to 13:3, more preferably 35:1 to 5:1, most preferably 27:1 to 7:1. Preferably, the mixture of gasses includes $CF_4$ and $CHF_3$; preferably the ratio by volume of $CF_4$: $CHF_3$ is 10:1 to 1:3, more preferably 8:1 to 1:2, most preferably 6:1 to 1:1. The gas mixture and plasma may also include other gasses, such as He, Ne or Ar. The pressure during etching is greater than 4 mTorr, preferably at least 10 mTorr, such as 10–80 mTorr, more preferably at least 15 mTorr, such as 15–45 mTorr, most preferably 25–35 mTorr.

Figure 8:
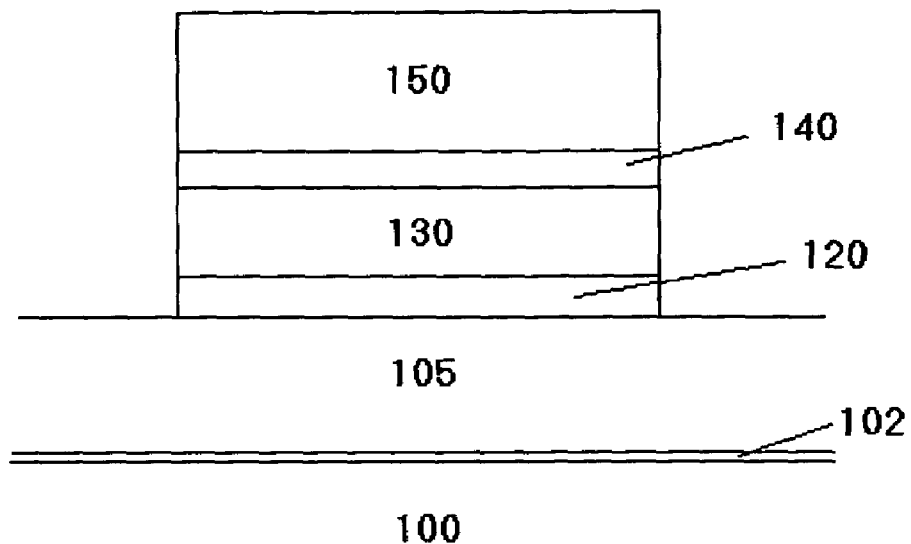
Figure 9:
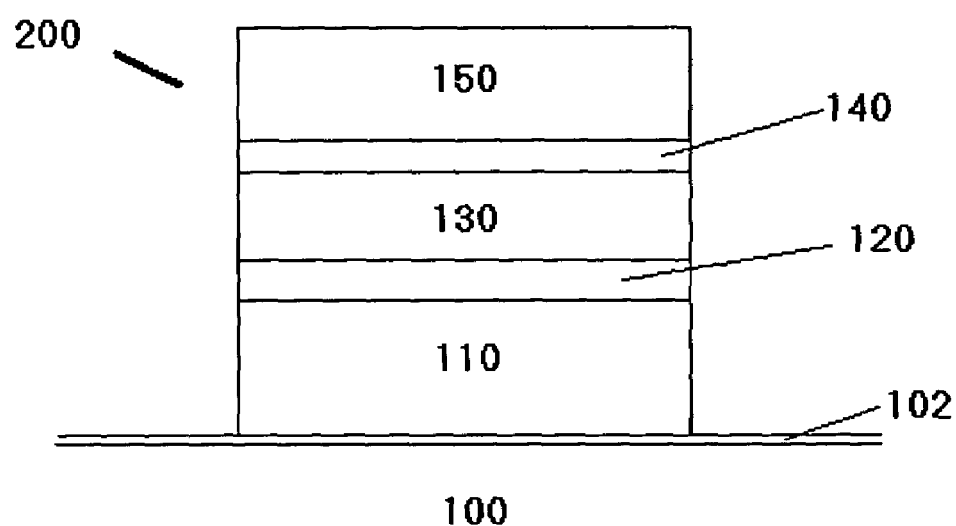
FIG. 9 shows a gate stack.

The patterned etch-stop layer may be used as a hard mask for the etching of the metallic layer 125 (FIG. 7) to form a patterned metallic layer 130 (FIG. 8). The patterned etch-stop layer and the patterned metallic layer may be used as a hard mask for the etching of the gate layer 105 (FIG. 8) to form patterned gate layer 110 (FIG. 9). The gate etching may be carried out by conventional gate etch techniques, for example by exposure to a plasma formed from chlorine, hydrobromic acid and/or oxygen.

The patterned photoresist 210 (FIG. 6) may be removed at any stage of the gate stack formation following the etch-stop etch. For example, the patterned photoresist may be removed immediately after the etch-stop etch (as illustrated in FIGS. 6 and 7), or it may be removed after the etching of the metallic layer or after the gate etching. The removal of the photoresist may be followed by a cleaning procedure to ensure removal of any residual byproduct of the photoresist or of the photoresist removal. For example, the photoresist may be removed by ashing the patterned photoresist to provide a gate stack containing a patterned etch-stop layer (FIG. 7). This gate stack without a photoresist layer may then be treated with a cleaning solution to complete the removal and cleaning process. The most preferred cleaning agent contains water, 2-(2 aminoethoxy) ethanol, hydroxylamine, and catechol. An example of a cleaning solution is EKC265™ (EKC, Hayward, Calif.).

FIG. 9 thus illustrates a gate stack 200 which may be formed on a semiconductor wafer. Semiconductor substrate 100 supports a gate insulating layer 102, which in turn supports a gate layer 110. The gate layer supports a metallic layer 130, which may optionally be separated from the gate layer by barrier layer 120. The metallic layer may optionally support a barrier layer 140. The etch-stop layer 150 is on the metallic layer 130, or optionally on the layer 140 above the metallic layer.

Further processing of the gate structure may include forming sidewall oxide regions 170 on gate layer 110 and forming spacers 160 (preferably containing nitride) on the sides of the stack. Furthermore, a dielectric layer 180 maybe formed on the etch-stop layer and contacts or via 190 formed through the dielectric to the substrate. This via may be lined and filled to form a via-contact, for example with TiN and tungsten, respectively. Other processing may include forming contacts to the gate itself. After dielectric layer is formed, the etch-stop layer has a thickness of at least 800 angstroms, preferably at least 1100 angstroms, so that it may be used to allow formation of SAC.

Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

What is claimed is:

1. A method of forming a semiconductor structure, comprising:
   exposing a photoresist layer; followed by
   a first heating of the photoresist layer to a first temperature for 30 seconds to 3 minutes; followed by
   a second heating of the photoresist layer to a second temperature for 30 seconds to 3 minutes; followed by
   developing the photoresist layer;
   wherein the second temperature is 5–15° C. greater than the first temperature.

2. The method of claim 1, wherein the photoresist layer is on a substrate.

3. The method of claim 2, wherein the photoresist layer is on polysilicon layer.

4. The method of claim 2, wherein the photoresist layer is on a silicon nitride layer.

5. The method of claim 3, further comprising etching the polysilicon layer.

6. The method of claim 1, wherein the first temperature is 100–125° C.

7. The method of claim 1, wherein the second temperature is 125–150° C.

8. The method of claim 1, wherein the first heating is carried out for 45 seconds to 2 minutes.

9. The method of claim 1, wherein the second heating is carried out for 45 seconds to 2 minutes.

10. The method of claim 5, wherein:
    the first temperature is 100–125° C.,
    the second temperature is 125–150° C., the first heating is carried out for 45 seconds to 2 minutes, and the second heating is carried out for 45 seconds to 2 minutes.

11. A method of making a semiconductor device, comprising:

forming a semiconductor structure by the method of claim 1, and forming a semiconductor device from the semiconductor structure.

12. A method of making an electronic device, comprising:

forming a semiconductor device by the method of claim 12, and forming an electronic device comprising the semiconductor device.

13. A semiconductor structure produced by the method of claim 1.

14. A method of forming semiconductor structures, comprising:

exposing a photoresist layer; followed by a first heating of the photoresist layer to a first temperature; followed by a second heating of the photoresist layer to a second temperature; followed by developing the photoresist layer;

wherein the second temperature is 5–15° C. greater than the first temperature, and a standard deviation of the critical dimension between wafers is at least 10% smaller than a standard deviation of the critical dimension between wafers otherwise identical without the first heating.

15. The method of claim 15, wherein the standard deviation of the critical dimension between wafers is at least 15% smaller than the standard deviation of the critical dimension between wafers without the first heating.

16. The method of claim 15, wherein the standard deviation of the critical dimension between wafers is at least 20% smaller than the standard deviation of the critical dimension between wafers without the first heating.

17. A method of making semiconductor devices, comprising:

forming semiconductor structures by the method of claim 15, and forming semiconductor devices from the semiconductor structures.

18. A method of making an electronic device, comprising:

forming a semiconductor device by the method of claim 18, and forming an electronic device comprising the semiconductor device.

19. In a method of forming a semiconductor structure, including patterning a layer by forming the layer on a substrate, applying a photoresist on the layer, exposing the photoresist, performing a post exposure bake, developing the photoresist, and etching the layer, the improvement comprising heating of the photoresist after exposure but prior to the post exposure bake, at a temperature 5–15° C. less than the post exposure bake, for 45 seconds to 3 minutes.

* * * * *

UNITED STATES PATENT AND TRADEMARK OFFICE
CERTIFICATE OF CORRECTION

| | | |
|---|---|---|
| PATENT NO. | : 7,071,124 B1 | Page 1 of 1 |
| APPLICATION NO. | : 10/950362 | |
| DATED | : September 24, 2004 | |
| INVENTOR(S) | : Chidam Kallingal et al. | |

It is certified that error appears in the above-identified patent and that said Letters Patent is hereby corrected as shown below:

In the claims:

In claim 12, column 7, line 13, please delete "12" and insert --11--.

In claim 15, column 8, line 1, please delete "15" and insert --14--.

In claim 16, column 8, line 5, please delete "15" and insert --14--.

Signed and Sealed this

Fifth Day of December, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,071,124 B1 | Page 1 of 1 |
| APPLICATION NO. | : 10/950362 | |
| DATED | : July 4, 2006 | |
| INVENTOR(S) | : Chidam Kallingal et al. | |

It is certified that error appears in the above-identified patent and that said Letters Patent is hereby corrected as shown below:

In the claims:

In claim 12, column 7, line 13, please delete "12" and insert --11--.

In claim 15, column 8, line 1, please delete "15" and insert --14--.

In claim 16, column 8, line 5, please delete "15" and insert --14--.

This certificate supersedes Certificate of Correction issued December 5, 2006.

Signed and Sealed this

Second Day of January, 2007

JON W. DUDAS
*Director of the United States Patent and Trademark Office*